US011155918B2

(12) United States Patent
Kato

(10) Patent No.: US 11,155,918 B2
(45) Date of Patent: Oct. 26, 2021

(54) FILM FORMING APPARATUS

(71) Applicant: TOKYO ELECTRON LIMITED, Tokyo (JP)

(72) Inventor: Hitoshi Kato, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 261 days.

(21) Appl. No.: 15/896,366

(22) Filed: Feb. 14, 2018

(65) Prior Publication Data

US 2018/0245218 A1    Aug. 30, 2018

(30) Foreign Application Priority Data

Feb. 24, 2017   (JP) .............................. JP2017-033518

(51) Int. Cl.
*C23C 16/455* (2006.01)
*H01J 37/32* (2006.01)
(Continued)

(52) U.S. Cl.
CPC ...... *C23C 16/45548* (2013.01); *C23C 16/402* (2013.01); *C23C 16/452* (2013.01);
(Continued)

(58) Field of Classification Search
CPC ......... H01L 21/68771; H01L 21/68764; H01L 21/67376; C23C 16/45525–45555;
(Continued)

(56) References Cited

U.S. PATENT DOCUMENTS 5,919,332 A * 7/1999 Koshiishi ............ C23C 16/5096
118/723 E
2010/0206231 A1 * 8/2010 Yoon .................... H01J 37/3244
118/723 I
(Continued)

FOREIGN PATENT DOCUMENTS

JP          9-97786 A      4/1997
JP          10-27785 A     1/1998
(Continued)

*Primary Examiner* — Aiden Lee
(74) *Attorney, Agent, or Firm* — Nath, Goldberg & Meyer; Jerald L. Meyer; Tanya E. Harkins

(57) ABSTRACT

A film forming apparatus includes: first and second processing gas supply parts configured to supply first and second processing gases, respectively; a plasma-generating gas supply part configured to supply a plasma-generating gas; a plasma forming part configured to convert the plasma-generating gas into plasma; a receiving vessel inserted into an opening formed in a ceiling portion of a vacuum vessel, the receiving vessel having a bottom surface portion facing a rotary table and being engaged with the plasma forming part on an upper surface of the bottom surface portion; a dielectric shield member arranged between the receiving vessel and an inner peripheral surface of the opening; a height adjustment part configured to adjust an arrangement height position of the bottom surface portion; and one or more sealing parts configured to hermetically close a space between the vacuum vessel and the receiving vessel.

8 Claims, 10 Drawing Sheets

(51) Int. Cl.
    *C23C 16/40*    (2006.01)
    *C23C 16/452*   (2006.01)
    *C23C 16/458*   (2006.01)
    *H01L 21/673*   (2006.01)
    *H01L 21/687*   (2006.01)
    *C23C 16/505*   (2006.01)

(52) U.S. Cl.
    CPC .... *C23C 16/4584* (2013.01); *C23C 16/45551* (2013.01); *C23C 16/505* (2013.01); *H01J 37/321* (2013.01); *H01J 37/3244* (2013.01); *H01J 37/32192* (2013.01); *H01J 37/32798* (2013.01); *H01L 21/67376* (2013.01); *H01L 21/68764* (2013.01); *H01L 21/68771* (2013.01)

(58) Field of Classification Search
    CPC . C23C 16/452; C23C 16/402; C23C 16/4584; C23C 16/505; C23C 16/45563; C23C 16/45574; C23C 16/45578; H01J 37/32798; H01J 37/3244; H01J 37/321–32119
    USPC ...................................................... 118/723 R
    See application file for complete search history.

(56) References Cited

U.S. PATENT DOCUMENTS

| | | | | |
|---|---|---|---|---|
| 2011/0226181 | A1* | 9/2011 | Yamamoto | H01L 21/76843 118/724 |
| 2011/0303362 | A1* | 12/2011 | Saito | C23C 16/45563 156/345.33 |
| 2013/0000558 | A1* | 1/2013 | Hara | C23C 16/45593 118/724 |
| 2013/0164942 | A1* | 6/2013 | Kato | C23C 16/45536 438/758 |
| 2014/0352889 | A1* | 12/2014 | Ansell | H01J 37/32862 156/345.35 |
| 2015/0004332 | A1* | 1/2015 | Kato | C23C 16/45557 427/579 |
| 2015/0126044 | A1* | 5/2015 | Kato | H01L 21/02274 438/790 |
| 2018/0037990 | A1* | 2/2018 | Kato | H01L 21/0228 |

FOREIGN PATENT DOCUMENTS

| | | |
|---|---|---|
| JP | 2015-12021 A | 1/2015 |
| JP | 201590916 A | 5/2015 |
| WO | 2013/137115 A1 | 9/2013 |

* cited by examiner

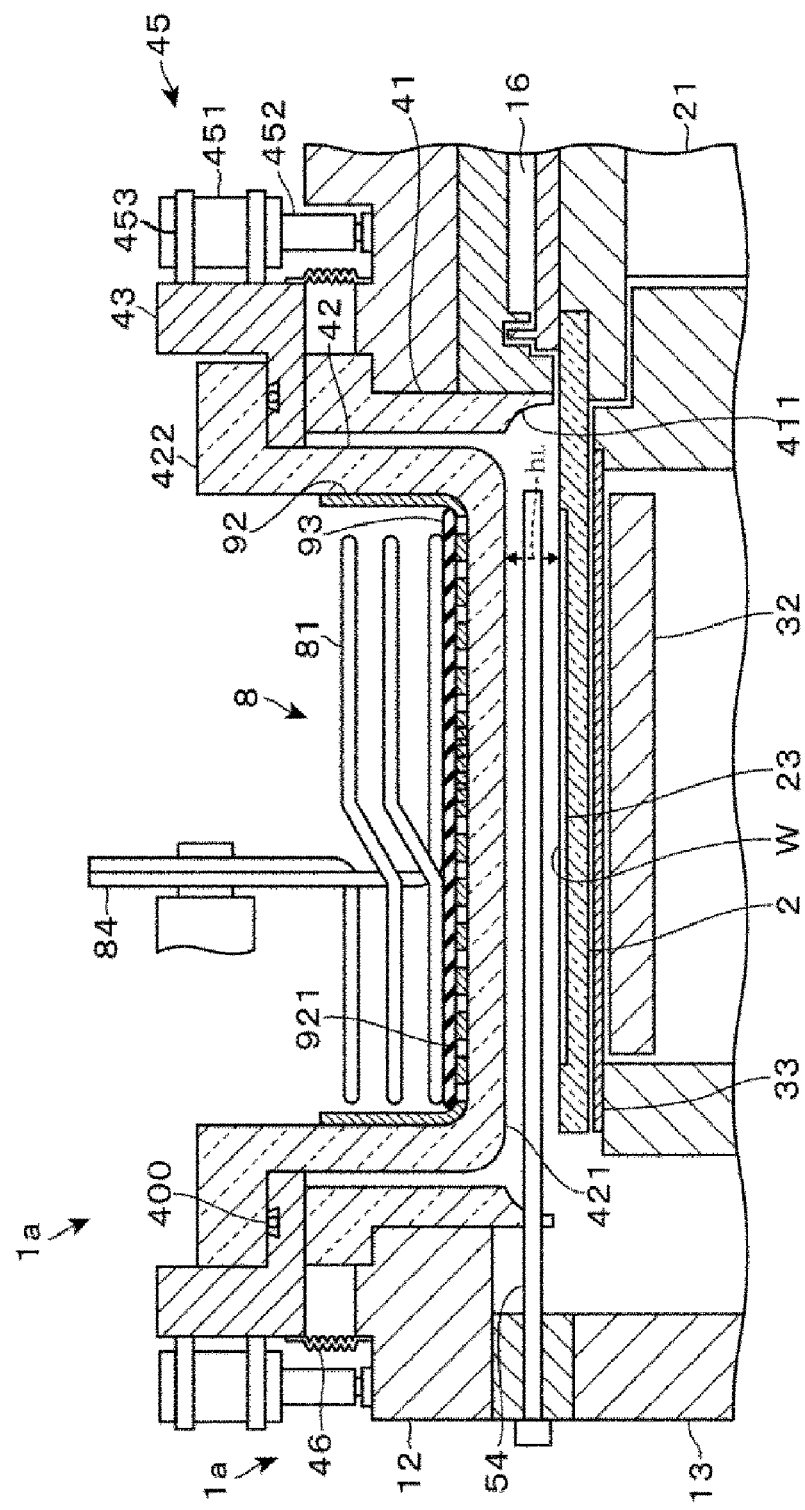

FILM FORMING APPARATUS

CROSS-REFERENCE TO RELATED APPLICATION(S)

This application is based upon and claims the benefit of priority from Japanese Patent Application No. 2017-0033518, filed on Feb. 24, 2017, the entire contents of which are incorporated herein by reference.

TECHNICAL FIELD

The present disclosure relates to a technique of using plasma to form a film on a substrate.

BACKGROUND

As a film forming apparatus for forming a film on a semiconductor wafer (hereinafter, referred to as a "wafer") as a substrate, there is an apparatus in which a plurality of wafers are loaded on a rotary table arranged in a vacuum vessel so as to surround the center of rotation thereof, and a plurality of processing regions (first and second processing regions) are separately arranged so that different processing gases are supplied to predetermined positions on an upper side of the rotary table. In this film forming apparatus, when the rotary table is rotated, each substrate repeatedly passes through the respective processing regions in order while revolving around the center of rotation and the processing gas reacts on the surface of the substrate, whereby atomic layers or molecular layers are laminated to form a film.

In the above-mentioned film forming apparatus, there is a case where a plasma-generating gas supplied into the vacuum vessel is converted into plasma and plasma processing is performed on the substrate using this plasma. For example, the applicant of the present application is developing a film forming apparatus which can change the characteristics of plasma processing by moving a plasma forming part (plasma generating means) up and down and changing a distance between the plasma forming part and a rotary table.

The inventor of the present disclosure has developed a technique capable of moving the plasma forming part up and down while more stably forming plasma.

SUMMARY

The present disclosure provides some embodiments of a film forming apparatus capable of performing plasma processing by forming stable plasma while changing an arrangement height position of a plasma forming part.

According to one embodiment of the present disclosure, a film forming apparatus for forming a film sequentially supplies a first processing gas and a second processing gas to a substrate while rotating the substrate around a center of rotation of a rotary table located within a vacuum vessel made of metal by mounting the substrate on a substrate mounting region located on an upper surface side of the rotary table and rotating the rotary table. The apparatus includes: a first processing gas supply part and a second processing gas supply part configured to supply a first processing gas and a second processing gas to a first processing region and a second processing region, respectively, which are separated from each other in a circumferential direction of the rotary table via separation regions; a plasma-generating gas supply part configured to supply a plasma-generating gas for performing a plasma processing on the substrate into the vacuum vessel; a plasma forming part configured to convert the plasma-generating gas into plasma; a receiving vessel inserted into an opening formed in a ceiling portion of the vacuum vessel, the receiving vessel having a bottom surface portion facing an upper surface of the rotary table and being engaged with the plasma forming part on an upper surface of the bottom surface portion; a dielectric shield member arranged between the receiving vessel and an inner peripheral surface of the opening of the vacuum vessel and located annularly along a circumferential direction of the inner peripheral surface; a height adjustment part configured to adjust an arrangement height position of the bottom surface portion of the receiving vessel inserted into the vacuum vessel; and one or more sealing parts configured to hermetically close a space between the vacuum vessel and the receiving vessel inserted into the opening.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 10 is a second enlarged longitudinal sectional view of a film forming apparatus having the elevating mechanism.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A film forming apparatus 1 for forming a $SiO_2$ film on a wafer W as a substrate by an atomic layer deposition (ALD)

method will be described as an embodiment of the present disclosure. An outline of the ALD method performed in the film forming apparatus 1 of this example will be described. A gas obtained by vaporizing, for example, bistertiary-butyl aminosilane (BTBAS) which is a raw material gas containing silicon (Si) (first processing gas), is adsorbed onto the wafer W, and thereafter, an ozone ($O_3$) gas which is an oxidizing gas (second processing gas) for oxidizing the BTBAS is supplied to the surface of the wafer W to form a molecular layer of silicon dioxide ($SiO_2$). By repeatedly performing this series of processes on one wafer W a plurality of times, a $SiO_2$ film is formed.

Figure 1:
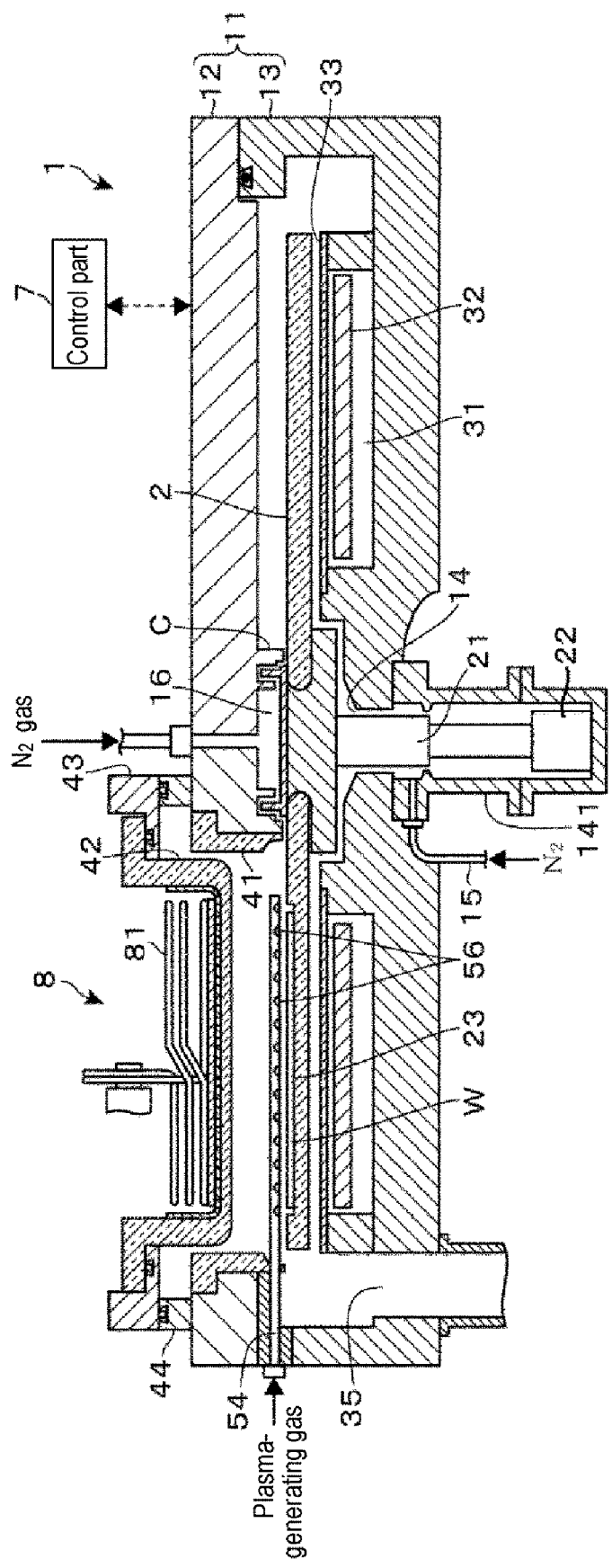
FIG. 1 is a longitudinal sectional view of a film forming apparatus according to an embodiment of the present disclosure.
Figure 2:
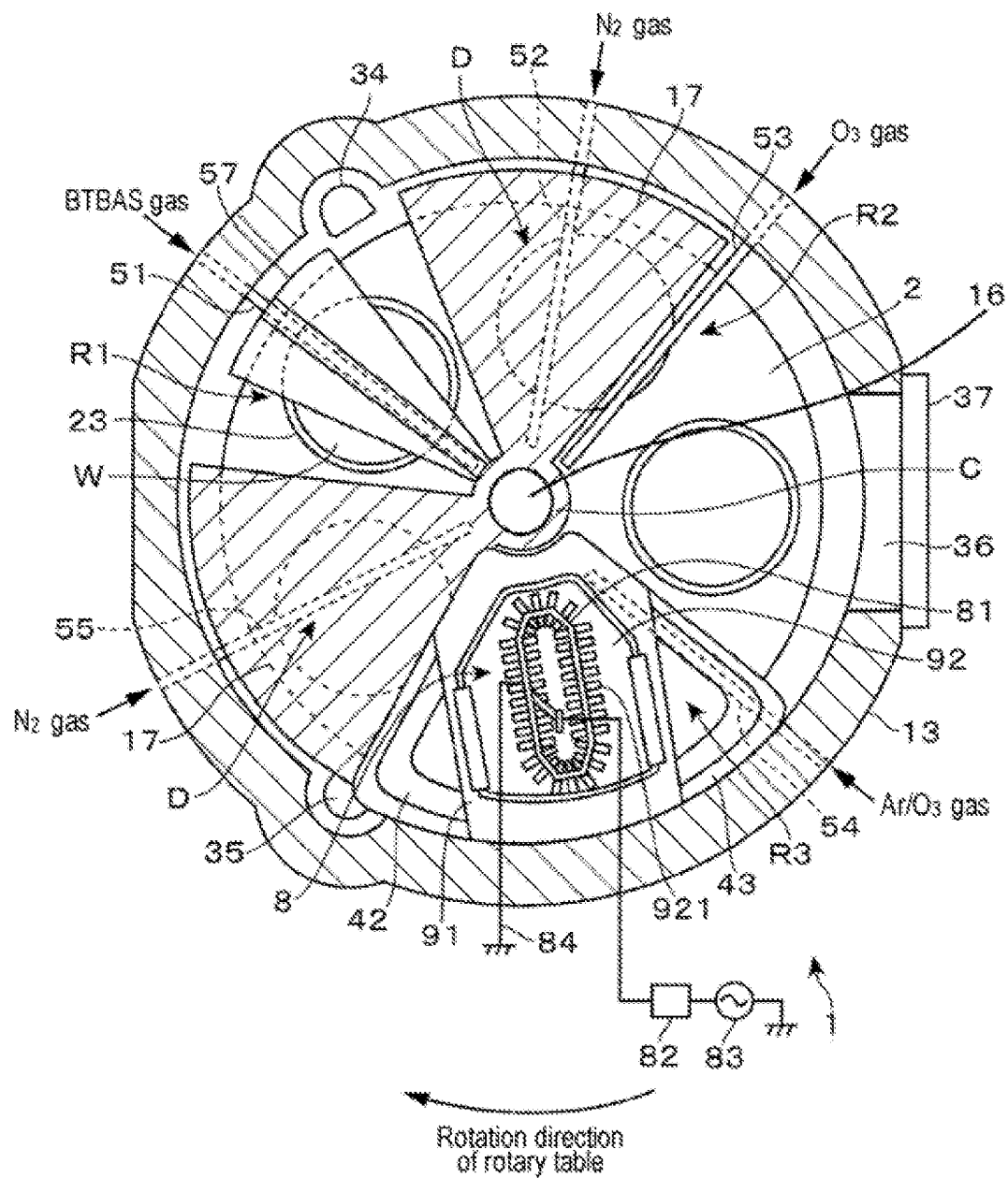
FIG. 2 is a traverse plan view of the film forming apparatus.

As illustrated in FIGS. 1 and 2, the film forming apparatus 1 has a substantially circular and flat metallic vacuum vessel 11, and a disc-shaped rotary table 2 installed in the vacuum vessel 11. The vacuum vessel 11 includes a ceiling plate 12 forming a ceiling portion and a vessel body 13 forming a sidewall and a bottom portion of the vacuum vessel 11.

The rotary table 2 is made of, for example, quartz glass (hereinafter, simply referred to as "quartz"), and a rotary shaft 21 made of metal extending vertically downward is installed at the central part thereof. The rotary shaft 21 is inserted into an opening 14 formed at the bottom portion of the vessel body 13 and a sleeve 141 with its lower end closed, and a rotary drive part 22 is connected to a lower end portion of the rotary shaft 21. If the possibility of contamination of the wafer W by metal is small, the rotary table 2 may also be made of metal such as stainless steel.

The rotary table 2 is horizontally supported in the vacuum vessel 11 via the rotary shaft 21 and rotates, for example, clockwise in a plan view, by the action of the rotary drive part 22.

Furthermore, a gas supply pipe 15 for supplying a nitrogen ($N_2$) gas to a gap between the sleeve 141 and the rotary shaft 21 or between the opening 14 of the vessel body 13 and the rotary shaft 21 is installed in an upper end portion of the sleeve 141 in order to prevent a raw material gas, an oxidizing gas, or the like from entering from the upper surface side to the lower surface side of the rotary table 2.

On the other hand, a central region C, which protrudes toward the central part of the rotary table 2 and has an annular planar shape, is formed on a lower surface of the ceiling plate 12 constituting the vacuum vessel 11. In addition, protrusions 17 having a fan-like planar shape which widens from the central region C toward the outer side of the rotary table 2 are installed on the lower surface of the ceiling plate 12 at two positions spaced apart from each other in a circumferential direction of the rotary table 2. In other words, these central region C and protrusions 17 form a ceiling surface, which is lower than the outer region of the ceiling plate 12, on the lower surface of the ceiling plate 12.

A gap between the inner side of the central region C and the central part of the rotary table 2 forms a flow path 16 of the $N_2$ gas. The $N_2$ gas is supplied to this flow path 16 from a gas supply pipe connected to the ceiling plate 12. The $N_2$ gas flowing into the flow path 16 is discharged, from a gap between the upper surface of the rotary table 2 and the central region C, radially outwardly of the rotary table 2 over the entire circumference. This $N_2$ gas prevents the raw material gas and the oxidizing gas supplied to different positions (an adsorption region (first processing region) R1 and an oxidation region (second processing region) R2 to be described later) on the rotary table 2 from making contact with each other by bypassing the central part (flow path 16) of the rotary table 2.

As illustrated in FIG. 1, a flat annular recess 31 is formed on the bottom surface of the vessel body 13, which is located below the rotary table 2, along the circumferential direction of the rotary table 2 in a plan view. A heater 32 configured as, for example, an elongated tubular carbon wire heater, is arranged on a bottom surface of the recess 31 over a region that faces the entire lower surface of the rotary table 2 (the heater 32 is schematically illustrated in FIG. 1). The heater 32 generates heat by power fed from a power feeding part (not shown), and heats the wafer W through the rotary table 2.

The upper surface of the recess 31 in which the heater 32 is arranged is closed by a lid 33 which is an annular plate member made of, for example, quartz.

In addition, exhaust ports 34 and 35 for exhausting the interior of the vacuum vessel 11 are opened on the bottom surface of the vessel body 13 located on an outer peripheral side of the recess 31. A vacuum exhaust mechanism (not shown) which includes a vacuum pump or the like is connected to the downstream side of the exhaust ports 34 and 35.

Furthermore, as illustrated in FIG. 2, a loading/unloading port 36 of wafers W and a gate valve 37 for opening and closing the loading/unloading port 36 are installed on a sidewall of the vessel body 13. The wafers W supported by an external transfer mechanism are carried into the vacuum vessel 11 via the loading/unloading port 36. A plurality of recesses 23 forming a mounting region of the wafers W are formed on the upper surface of the rotary table 2 so as to surround the flow path 16 corresponding to the center of rotation of the rotary table 2. The wafers W carried into the vacuum vessel 11 are mounted on the respective recesses 23. The wafers W are transferred between the transfer mechanism and the recesses 23 via lift pins configured to move up and down between the upper position and the lower position of the rotary table 2 via through holes (not shown) formed in the respective recesses 23 (a description of the lift pins is omitted).

Furthermore, as illustrated in FIG. 2, a raw material gas nozzle 51, a separation gas nozzle 52, an oxidizing gas nozzle 53, a plasma gas nozzle 54, and a separation gas nozzle 55 are arranged in this order above the rotary table 2 at intervals along the rotation direction of the rotary table 2. These gas nozzles 51 to 55 include rod-shaped nozzle bodies extending horizontally along the radial direction from the sidewall of the vacuum vessel 11 toward the central part of the rotary table 2. A plurality of discharge ports 56 are formed at intervals on the lower surface of the nozzle body forming each of the gas nozzles 51 to 55.

Figure 6:
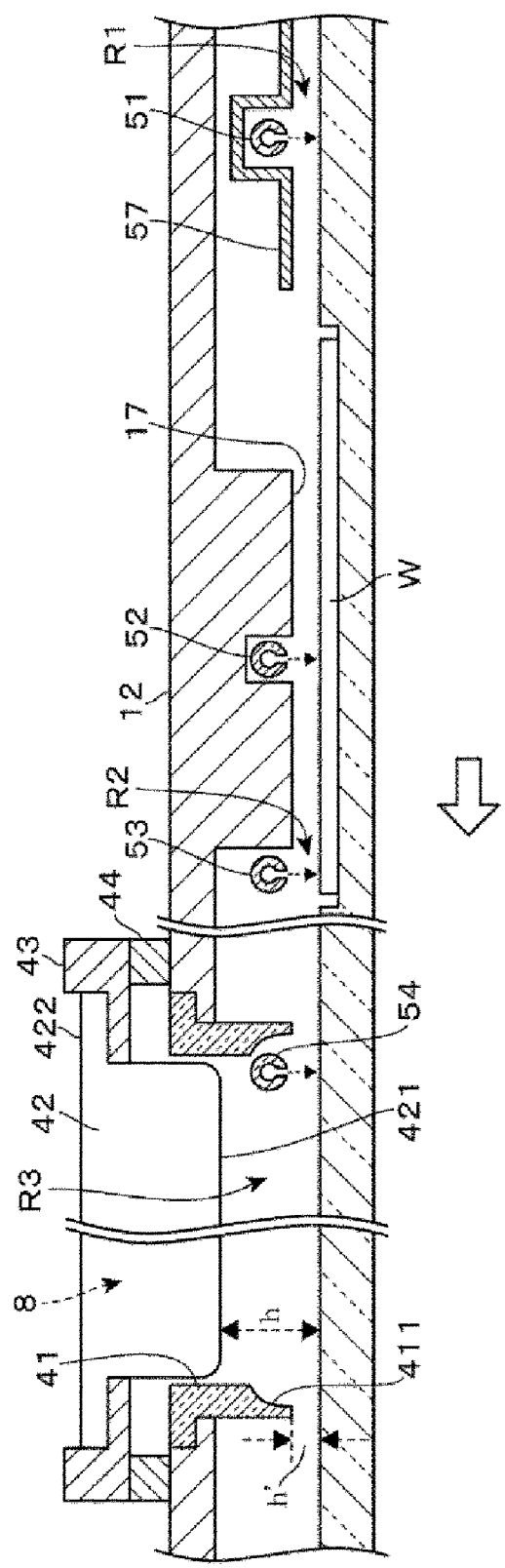
FIG. 6 is a longitudinal sectional view illustrating each processing region and a separation region formed in the film forming apparatus.

The raw material gas nozzle 51 discharges the aforementioned BTBAS gas supplied from a raw material gas supply source (not shown) toward the upper surface of the rotary table 2. As illustrated in FIGS. 2 and 6, the raw material gas nozzle 51 is covered with a nozzle cover 57 formed in a fan shape which widens from the raw material gas nozzle 51 toward each of the upstream side and the downstream side of the rotary table 2 in the rotation direction. The nozzle cover 57 contributes to increasing the concentration of the BTBAS gas under the nozzle cover 57 to improve the absorptivity of the BTBAS gas to the wafers W. The raw material gas nozzle 51 constitutes a first processing gas supply part of this example.

The oxidizing gas nozzle 53 discharges an ozone gas supplied from an oxidizing gas supply source (not shown) toward the upper surface of the rotary table 2. The oxidizing gas nozzle 53 constitutes a second processing gas supply part of this example.

Furthermore, in the present disclosure, the direction along the rotation direction of the rotary table 2 from a predetermined reference position is referred to as the downstream side in the rotation direction, and the opposite direction is referred to as the upstream side.

The separation gas nozzles 52 and 55 discharge an inert gas as a separation gas, for example, an $N_2$ gas, toward the upper surface of the rotary table 2. As illustrated in FIGS. 2 and 6, the respective separation gas nozzles 52 and 55 are arranged in concave portions formed at positions where the fan-shaped protrusions 17 formed on the ceiling plate 12 are divided in the circumferential direction.

The plasma gas nozzle 54 discharges a plasma-generating gas supplied from a plasma-generating gas supply source (not shown), for example, a mixed gas of an argon (Ar) gas and an oxygen ($O_2$) gas, toward the upper surface of the rotary table 2. The plasma gas nozzle 54 constitutes a plasma-generating gas supply part of this example.

Figure 3:
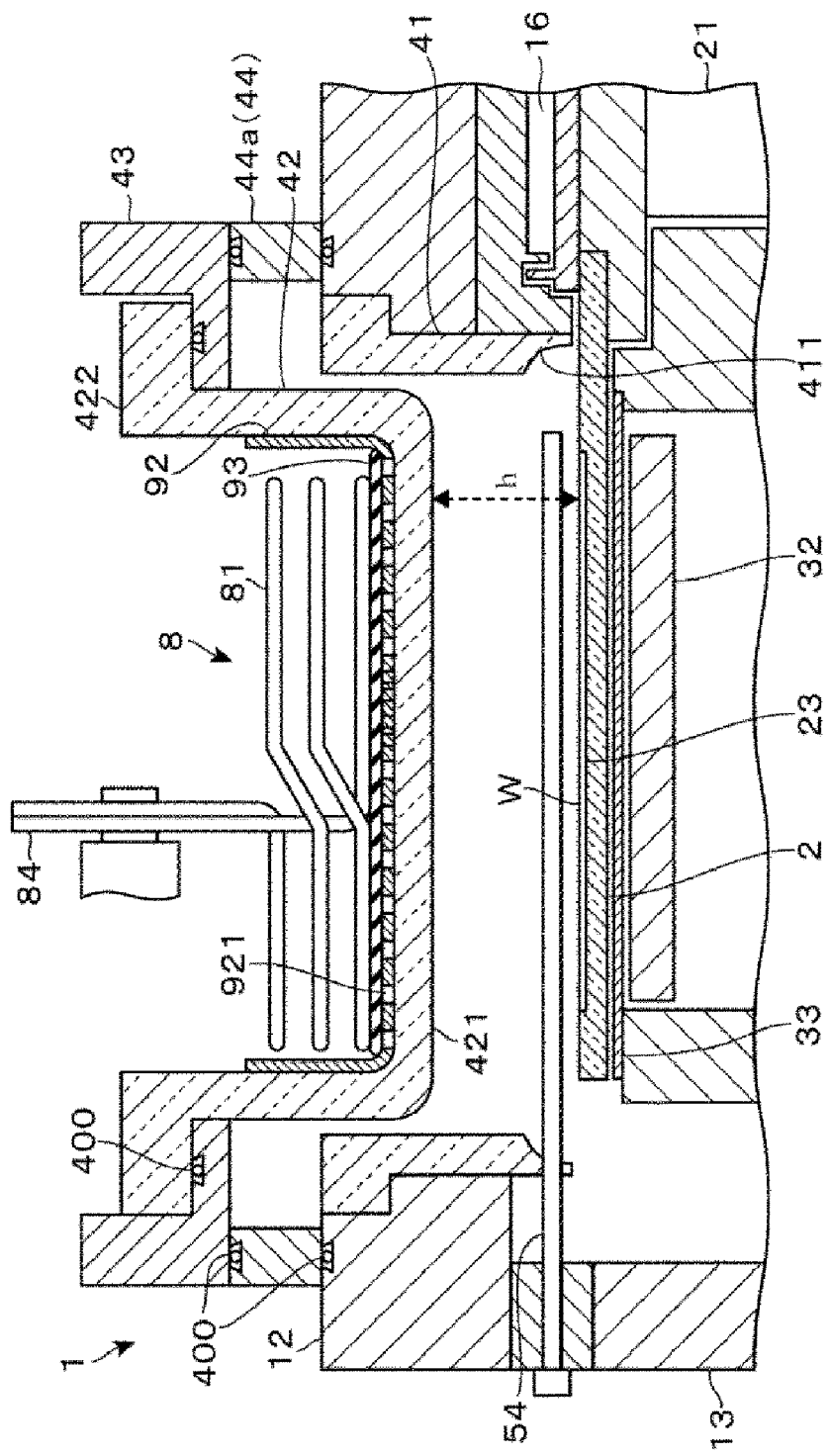
FIG. 3 is an enlarged longitudinal sectional view of the film forming apparatus.
Figure 4:
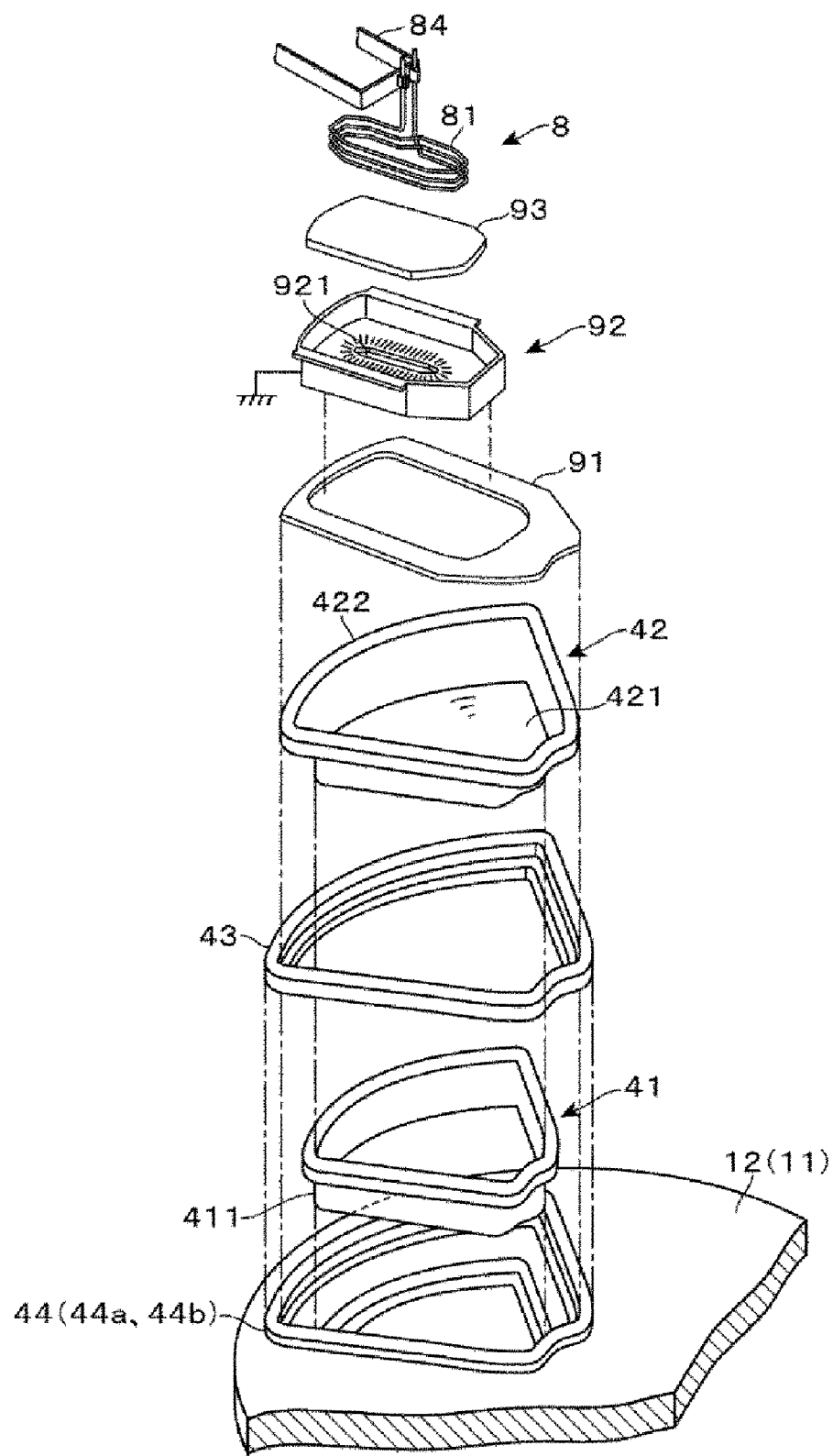
FIG. 4 is an exploded perspective view of a plasma forming part and the like installed in the film forming apparatus.

Here, as illustrated in FIG. 4, a fan-shaped opening which widens along the rotation direction of the rotary table 2 is formed in the ceiling plate 12. A receiving vessel 42 for receiving a plasma forming part 8, which will be described later, is inserted into this opening (FIGS. 1 and 3). The receiving vessel 42 is made of a dielectric material such as quartz, has a planar shape corresponding to the opening, and is formed in a cup shape in a longitudinal sectional shape. The receiving vessel 42 of this example is installed at a position close to the downstream side in a space between the oxidizing gas nozzle 53 and the protrusions 17 on the downstream side of the oxidizing gas nozzle 53, when viewed in the rotation direction of the rotary table 2. The plasma gas nozzle 54 is located at the lower side of the receiving vessel 42 and at the upstream side of the receiving vessel 42 in the rotation direction of the rotary table 2, and is inserted along the side of the receiving vessel 42 extending in the radial direction.

On the upper surface side of the rotary table 2, the region below the nozzle cover 57 of the raw material gas nozzle 51 is an adsorption region R1 in which adsorption of the BTBAS gas as the raw material gas is performed, and the region below the oxidation gas nozzle 53 is an oxidization region R2 in which oxidation of the BTBAS gas is performed by an ozone gas.

In this embodiment, the adsorption region R1 corresponds to the first processing region, and the oxidation region R2 corresponds to the second processing region.

In addition, a portion (a space between a plasma window 421 to be described later and the rotary table 2) below the receiving vessel 42 is defined as a plasma forming region R3 in which modification of the $SiO_2$ film is performed by plasma. Furthermore, the regions below the protrusions 17 respectively form separation regions D to prevent the raw material gas and the oxidizing gas from being mixed by separating the adsorption region R1 and the oxidation region R2 from each other by the $N_2$ gas discharged from each of the separation gas nozzles 52 and 55.

Furthermore, the exhaust port 34 on one side, which is formed on the bottom surface of the vessel body 13, is located near the downstream end of the nozzle cover 57 (adsorption region R1) and is opened to the outside of the rotary table 2 to exhaust the surplus BTBAS gas. The exhaust port 35 on the other side is located between the plasma forming region R3 and the separation region D adjacent to the plasma forming region R3 at the downstream side in the rotation direction, and is opened to the outside of the rotary table 2 to exhaust the surplus ozone gas or plasma-generating gas. The $N_2$ gas supplied from each of the separation regions D, the gas supply pipe 15 below the rotary table 2, and the central region C of the rotary table 2 is also exhausted from the respective exhaust ports 34 and 35.

Next, a configuration of the plasma forming part 8 and the like received in the receiving vessel 42 will be described in detail.

As illustrated in FIG. 3 or FIG. 4 which is an exploded perspective view, if the bottom surface portion of the receiving vessel 42 formed in a cup shape is referred to as the plasma window 421, a box type Faraday shield 92 with its upper surface side opened is arranged on an upper surface side of the plasma window 421. The Faraday shield 92 is supported by the receiving vessel 42 via a frame-shaped member 91 that extends over the upper surface of the receiving vessel 42. An insulating plate 93 is arranged on a bottom surface of the Faraday shield 92, and the plasma forming part 8 is received on an upper surface side of the insulating plate 93.

As illustrated in FIG. 4, the bottom surface of the Faraday shield 92 constitutes a grounded conductive plate-shaped member. A slit 921 is formed in the plate-shaped member and prevents an electric field component of an electromagnetic field generated in an antenna 81 to be described later when a high-frequency power is applied to the antenna 81 from being directed downward and directs the magnetic field component downward. This slit 921 extends in a direction perpendicular to (intersects with) the winding direction of the antenna 81. A plurality of slits 921 is formed along the winding direction of the antenna 81.

As illustrated in FIG. 4, for example, the plasma forming part 8 has the antenna 81 formed by winding a metal wire in a coil shape around a vertical axis. In a plan view, the plasma forming part 8 is disposed so as to span the passing region of the wafers W from the central side to the outer peripheral side of the rotary table 2. One end of the antenna 81 is connected to a high-frequency power source 83 via a connection electrode 84 and a matcher (matching box) 82 (see FIG. 2). A high-frequency power having, for example, a frequency of 13.56 MHz and an applied power of 5,000 W, is supplied from the high-frequency power source 83. The other end of the antenna 81 is grounded via another connection electrode 84.

In the plasma forming part 8 having the aforementioned configuration, when the high-frequency power is applied to the antenna 81, an electromagnetic field is generated around the plasma forming part 8, and a magnetic field component that has passed through the Faraday shield 92 is transmitted through the bottom surface portion of the receiving vessel 42 made of dielectric material, forming an inductive coupling that converts the plasma-generating gas supplied to the lower surface side of the receiving vessel 42 into plasma. Therefore, in this example, the bottom surface portion of the receiving vessel 42 that transmits a magnetic field for plasma generation is referred to as the "plasma window 421".

Moreover, since plasma of the plasma-generating gas is generated at a position near the plasma window 421, the arrangement height position of the plasma window 421 when viewed from the rotary table 2 (the wafers W on the rotary table 2) becomes an operational variable that changes the characteristics of the plasma processing.

Figure 5:
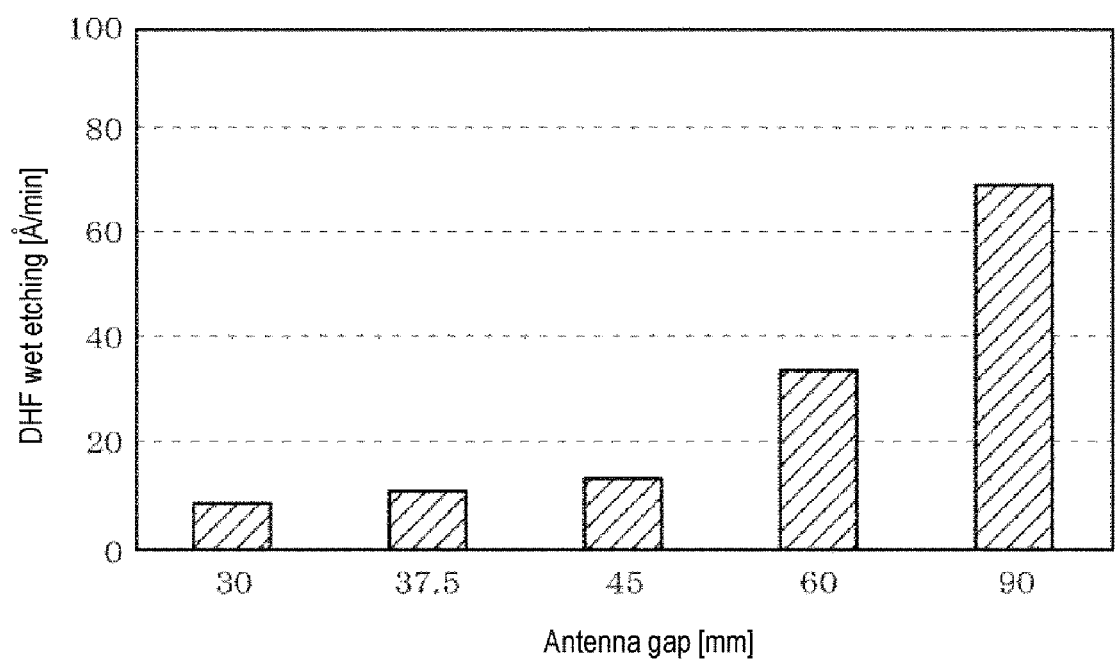
FIG. 5 is an explanatory view illustrating a relationship between an antenna gap and an etching rate of a film formed by the film forming apparatus.

For example, FIG. 5 illustrate a variation in an etching rate when an $SiO_2$ film is formed by changing a distance (which is indicated as an "Antenna gap" in FIG. 5) between the rotary table 2 and the plasma window 421 and the $SiO_2$ film as formed is wet-etched using a diluted hydrofluoric acid (DHF).

As the antenna gap is shortened, the $SiO_2$ film becomes dense and hard because ions with a relatively short lifespan and high reactivity can be more highly supplied to the surface of the wafers W. As a result, it can be confirmed that the etching rate of the $SiO_2$ film tends to decrease (the region corresponding to the left side in the horizontal axis in FIG. 5).

In addition, in the case where a film is formed on a pattern formed on the surface of the wafer W, it is likely that ions with a short lifespan easily react in the upper region and, compared with the upper region, hardly react in the lower region. As a result, it is likely that a film having distribution characteristics in which the upper side of the pattern is dense and hard and the lower side of the pattern is soft.

On the other hand, as the antenna gap is lengthened, active species supplied to the surface of the wafers W mainly have a longer lifespan and lower reactivity than the ions. As a result, the film on which the plasma processing has been performed has relatively low denseness and becomes relatively soft, compared with the case where there are many ions. As a result, it can be confirmed that the etching rate of the $SiO_2$ film tends to increase (the region corresponding to the right side in the horizontal axis in FIG. 5).

In addition, in the case where a film is formed on a pattern formed on the surface of the wafer W, since radicals having a relatively long lifespan easily enter the pattern, it is likely that a uniform plasma processing is performed on the upper side and lower side of the pattern, compared with the case where there are many ions.

As described above, the plasma forming part 8 can adjust the plasma processing result according to the arrangement height of the plasma window 421. Therefore, the film forming apparatus 1 of this example can change the arrangement height position of the plasma window 421 by moving the receiving vessel 42 inserted into the opening of the ceiling plate 12 up and down.

Hereinafter, the function of changing the arrangement height position of the plasma window 421 will be described with reference to FIGS. 3 and 4 and the like.

As illustrated in FIGS. 3 and 4, the receiving vessel 42 of this example formed in a cup shape has a flange-shaped supported part 422 which outwardly widens along the circumferential direction of an edge portion, which forms an opening on the upper surface of a cup. This supported part 422 is formed in an annular fan shape much larger than the receiving vessel 42 and is supported from below by a frame body portion 43 which is a metallic member having a notch that can be fitted with the supported part 422.

Furthermore, a spacer 44 which is a metallic member formed in an annular fan shape corresponding to the frame body portion 43 may be arranged below the frame body portion 43. A plurality of spacers 44a and 44b differing in height is provided in the film forming apparatus 1 of this example.

The frame body portion 43 is loaded directly (see FIG. 8) or via the spacers 44a and 44b (see FIGS. 3 and 7), on the upper surface of the ceiling plate 12 around the opening into which the receiving vessel 42 is inserted. Spaces between the upper surface of the ceiling plate 12 and the frame body portion 43 or between the upper surface of the ceiling plate 12 and the spacers 44a and 44b, between the spacers 44a and 44b and the frame body portion 43, and between the frame body portion 43 and the supported part 422 of the receiving vessel 42 are hermetically closed by O-rings 400 serving as sealing parts, respectively.

The frame body portion 43 and the spacers 44 (44a and 44b) correspond to a height adjustment part of this example. It can be considered that the height adjustment part of this example is vertically divided into the frame body portion 43 and the spacers 44. Here, the frame body portion 43 corresponds to an upper annular member and the spacers 44 correspond to a lower annular member.

The receiving vessel 42 is supported by the upper surface of the ceiling plate 12 (vacuum vessel 11) via the aforementioned height adjustment part (the frame body portion 43 and the spacers 44 (44a and 44b)). In this state, the lower portion of the receiving vessel 42 is inserted into the opening. A shield member 41 is installed between the receiving vessel 42 and the inner peripheral surface of the opening formed in the ceiling plate 12, along the circumferential direction of the opening when viewed from the receiving vessel 42, so as to cover the entire inner peripheral surface of the opening. The shield member 41 is made of, for example, a dielectric material such as quartz, and serves to prevent abnormal discharge from occurring between the plasma window 421 on the receiving vessel 42 side and the metallic ceiling plate 12.

The shield member 41 is inserted into the opening of the ceiling plate 12 and is suspendedly supported by the ceiling plate 12 with a flange portion, which is formed in an upper end portion of the shield member 41, engaged with a notch formed at the side of the opening of the ceiling plate 12.

For example, as illustrated in FIG. 6, the lower end portion of the shield member 41 defines a protrusion 411 protruding downward from the lower surface of the ceiling plate 12. A gap having a height h', which is narrower than a height h between the upper surface of the rotary table 2 and the plasma window 421, is formed between the protrusion 411 and the rotary table 2. The plasma gas nozzle 54 as described above is arranged in a region surrounded by the protrusion 411 (shield member 41).

The protrusion 411 serves to suppress a decrease in the concentration of the plasma-generating gas supplied into the space (corresponding to the plasma forming region R3) surrounded by the shield member 41. The protrusion 411 also serves to suppress the $N_2$ gas or ozone gas supplied outside of the space surrounded by the shield member 41 from entering the space surrounded by the shield member 41.

As illustrated in FIG. 3, the receiving vessel 42 is inserted into the shield member 41. Here, a gap is formed between the outer side surface of the receiving vessel 42 and the inner side surface of the shield member 41. However, since the spaces between the frame body portion 43 and the spacers 44, which are installed between the ceiling plate 12 and the supported part 422 of the receiving vessel 42, are hermetically sealed by the O-rings 400, the vacuum state in the vacuum vessel 11 is maintained.

As illustrated in FIG. 1, a control part 7 configured as a computer for controlling the entire operation of the apparatus is installed in the film forming apparatus 1 having the aforementioned configuration. A program for performing a film forming process on the wafer W is stored in the control part 7. The program causes a control signal to be transmitted to each part of the film forming apparatus 1, controlling the operation of each part. Specifically, the supply amount adjustment of various kinds of gases from the respective gas nozzles 51 to 55, the output control of the heater 32, the supply amount adjustment of the $N_2$ gas from the gas supply pipe 15 and the central region C, the rotational speed adjustment of the rotary table 2 by the rotary drive part 22, and the like are performed according to the control signal. In the program, a group of steps are organized to cause the respective operations described above to be executed by controlling these operations. The program is installed in the control part 7 from a storage medium such as a hard disk, a compact disc, a magneto-optical disc, a memory card, a flexible disk, or the like.

An operation of the film forming apparatus 1 having the aforementioned configuration will be described.

First, the film forming apparatus 1 adjusts the internal pressure of the vacuum vessel 11 and the output of the heater 32 to a state when wafers W are loaded, and waits for loading of the wafers W. Then, the wafers W to be processed are transferred, for example, by a transfer mechanism (not shown) installed in an adjacent vacuum transfer chamber, and the gate valve 37 is opened. The transfer mechanism enters the vacuum vessel 11 via the opened loading/unloading port 36, and mounts the wafers W on the recesses 23 of the rotary table 2. This operation is repeated while intermittently rotating the rotary table 2 so that the wafers W are mounted on the respective recesses 23.

When the loading of the wafers W is completed, the transfer mechanism is retracted from the interior of the vacuum vessel 11 and the gate valve 37 is closed. Thereafter, the interior of the vacuum vessel 11 is vacuum-exhausted to a predetermined pressure by exhaust from the exhaust ports 34 and 35. Furthermore, a predetermined amount of $N_2$ gas is supplied from each of the separation gas nozzles 52 and 55, the flow path 16 of the central region C, and the gas supply pipe 15 below the rotary table 2. The rotation of the rotary table 2 starts, and the rotational speed of the rotary table 2 is adjusted until a preset rotational speed is reached. The power supply from the power feed part to the heater 32 is initiated to heat the wafers W.

Thereafter, when the wafers W are heated to a preset temperature of, for example, 400 degrees C., the supply of various kinds of gases (a raw material gas, an oxidizing gas, and a plasma-generating gas) from the raw material gas nozzle 51, the oxidizing gas nozzle 53, and the plasma gas nozzle 54 starts, and a high-frequency power is applied to the plasma forming part 8.

The wafers W mounted on the respective recesses 23 of the rotary table 2 repeatedly passes through the adsorption region R1 below the nozzle cover 57 of the raw material gas nozzle 51, the oxidization region R2 below the oxidizing gas nozzle 53, and the plasma forming region R3 below the receiving vessel 42 (plasma forming part 8) in this order, by the supply of the raw material gas and the oxidizing gas (see FIG. 6).

A BTBAS gas discharged from the raw material gas nozzle 51 is adsorbed by the wafers W in the adsorption region R1 and the adsorbed BTBAS is oxidized by an ozone gas supplied from the oxidizing gas nozzle 53 in the oxidization region R2, forming a single or a plurality of molecular layers of $SiO_2$. Furthermore, in the plasma forming region R3, the molecular layers of $SiO_2$ formed on the wafers W is brought into contact with the active species supplied from the plasma, modifying the molecular layers.

As the rotation of the rotary table 2 continues in this manner, the molecular layers of $SiO_2$ are sequentially laminated on the surface of the wafers W to form an $SiO_2$ film and so that the film thickness of the $SiO_2$ film gradually increases.

At this time, the spaces between the adsorption region R1 and the oxidation region R2 and between the plasma forming region R3 and the adsorption region R1 are separated by the separation regions D, and therefore deposits caused by contact between the raw material gas and the oxidizing gas hardly occur in unnecessary places.

The supply of various kinds of gases from the raw material gas nozzle 51, the oxidizing gas nozzle 53, and the plasma gas nozzle 54 and the application of a high-frequency power to the plasma forming part 8 are stopped when an $SiO_2$ film having a desired thickness is formed on each of the wafers W by performing the aforementioned operations, for example, when the rotary table 2 is rotated a predetermined number of times. Then, the rotation of the rotary table 2 is stopped and the output of the heater 32 is set to a standby state, and the film forming process is completed.

Thereafter, the internal pressure of the vacuum vessel 11 is regulated to a state when the wafers W are unloaded, the gate valve 37 is opened, the wafers W are discharged in reverse order of that when the wafers are loaded, and the film forming process is completed.

In the film forming apparatus 1 in which a film is formed by the aforementioned operation, there may be a case where the characteristics required for the $SiO_2$ film are different when the plasma processing is performed in the plasma forming region R3. For example, as described with reference to FIG. 5, it is preferable to increase the influence of modification by ions when it is desired to form a denser and harder $SiO_2$ film, and it is preferable to increase the influence of modification by radicals when it is desired to perform more uniform modification between the upper side and the lower side of the pattern formed on the wafers W.

At this time, it is possible to make adjustments so that the influence of modification by ions becomes large or so that the influence of modification by radicals becomes large, for example, by changing the ionization state of the plasma-generating gas by increasing or decreasing the high-frequency power applied from the high-frequency power source 83.

However, in this case, since the size of the plasma may also change depending on the increase or decrease of the high-frequency power, it is likely that the in-plane uniformity of the plasma processing or the like changes before and after the increase or decrease of the high-frequency power.

Therefore, as described above, the film forming apparatus 1 of this example changes the arrangement height position of the plasma window 421 using the height adjustment part including the frame body portion 43 and the spacers 44a and 44b, thereby changing the characteristics of the plasma processing performed on the wafers W.

In the example illustrated in FIG. 3, the distance (antenna gap) between the upper surface of the rotary table 2 and the plasma window 421 may be set to h=45 mm, and the etching rate of the $SiO_2$ film, which is formed using the film forming apparatus 1, by DHF may be set to about 14 Å/min. If it is desired to make the film quality of the $SiO_2$ film denser, after the film forming apparatus 1 is stopped and the vacuum state of the vacuum vessel 11 is released, the frame body portion 43 and the receiving vessel 42 are moved up by a jig or the like and the spacer 44a in FIG. 3 is replaced by the spacer 44b having a height greater than that of the spacer 44a.

Figure 7:
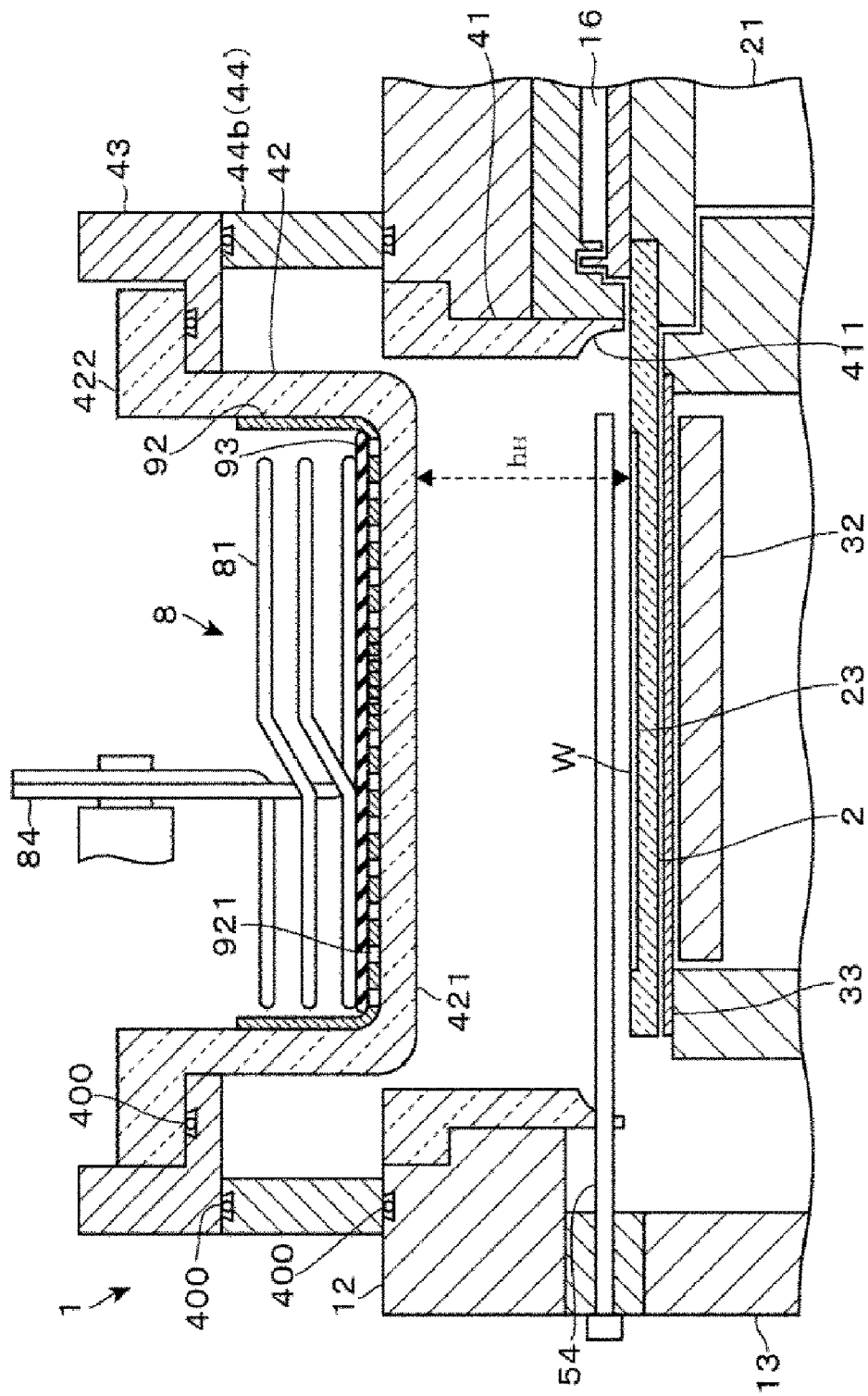
FIG. 7 is a first explanatory view about a change in arrangement height of a plasma window.

Thereafter, assuming that the frame body portion 43 and the receiving vessel 42 are mounted on the spacer 44b and the antenna gap is changed to $h_H$=90 mm as illustrated in FIG. 7, according to FIG. 5, the influence of radicals in the plasma processing is increased and thus the etching rate of the $SiO_2$ film formed under the above conditions can be increased to about 71 Å/min.

Figure 8:
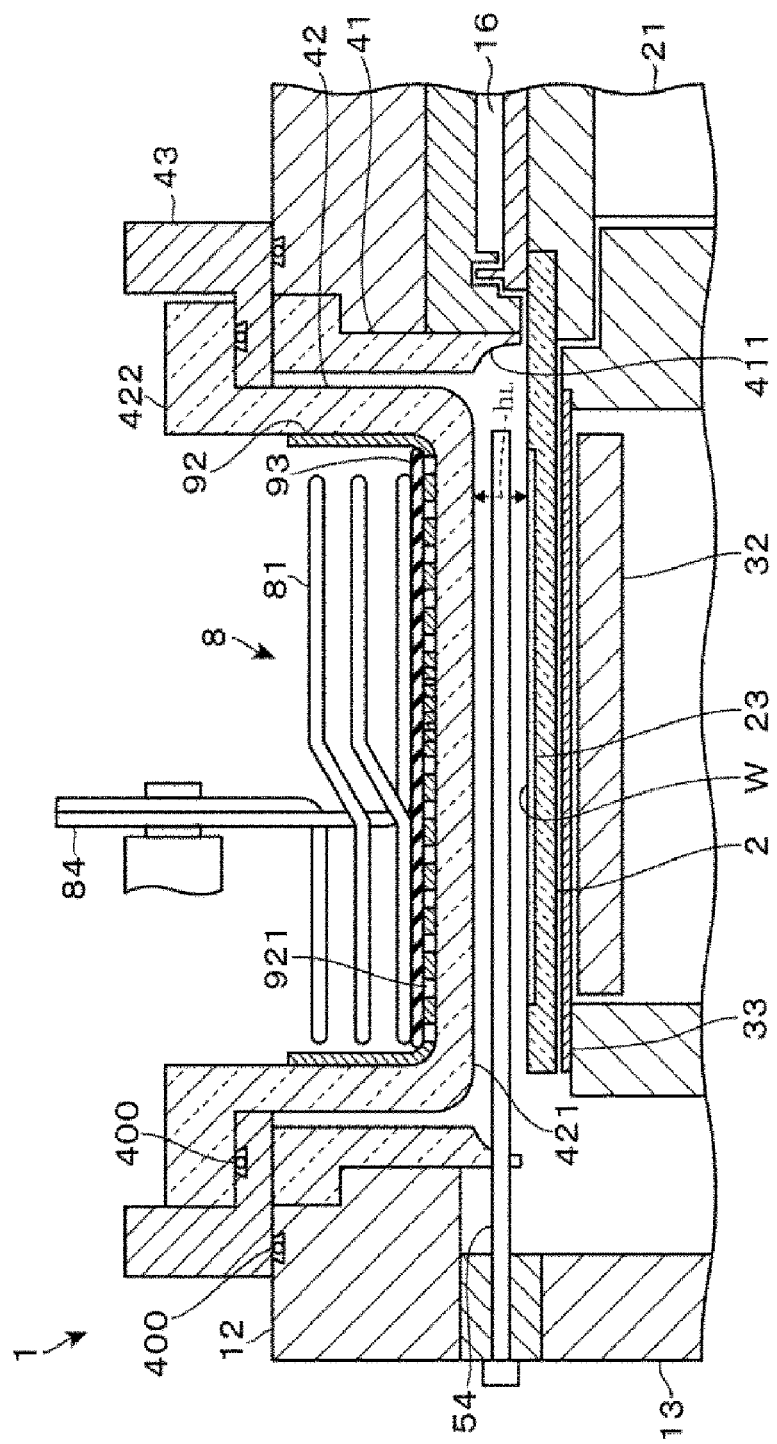
FIG. 8 is a second explanatory view about a change in arrangement height of the plasma window.

On the other hand, as illustrated in FIG. 8, assuming that the arrangement of the spacers 44a and 44b is omitted and the frame body portion 43 is directly mounted on the upper surface of the ceiling plate 12 to set the antenna gap to be $h_L$=30 mm, the influence of ions in the plasma processing is increased. Thus, according to FIG. 5, the etching rate of the SiO$_2$ film formed under the aforementioned conditions is lowered to about 9 Å/min.

In the film forming apparatus 1 of this example in which the arrangement height position of the plasma window 421 is moved up and down to change the characteristics of the plasma processing, since the high-frequency power applied to the antenna 81 can be kept constant, changes in the plasma state according to the increase and decrease of the high-frequency power hardly occur.

In addition, as a method for changing the arrangement height position of the plasma window 421, for example, a method in which plural types of receiving vessels 42 having different cup depths are prepared and the receiving vessel 42 itself is replaced depending on the arrangement, height position of the plasma window 421 may also be assumed. However, since the quartz receiving vessels 42 are expensive, preparing the plurality of receiving vessels 42 may cause an increase in the cost of the film forming apparatus 1. In this respect, in the film forming apparatus 1 of this example, it is possible to change the arrangement height position of the plasma window 421 only by replacing, removing, and rearranging the spacers 44a and 44b which are annular metallic members. As a result, it is possible not only to significantly reduce the cost but also to dramatically simplify the task of changing the arrangement height position of the plasma window 421.

Furthermore, since a member that supports the supported part 422 is vertically divided into the frame body portion 43 and the spacers 44a and 44b, and the spacer 44 has a relatively simple shape, only the plurality of spacers 44a and 44b need to have different heights. Thus, it is possible to further reduce the cost for the height adjustment part.

In this example, the height adjustment part can be an annular member in which the frame body portion 43 and the spacers 44a and 44b are integrated. This allows the height position of the plasma window 421 to be changed by merely replacing the annular member.

In the film forming apparatus 1 of this example, the receiving vessel 42 and the shield member 41 are separated from each other, and the shield member 41 is fixedly positioned to cover the inner peripheral surface of the opening of the ceiling plate 12.

For example, in the case where the receiving vessel 42 and the shield member 41 are integrally formed, when the receiving vessel 42 is arranged so that the plasma gap becomes large, it is likely that the inner peripheral surface of the metallic ceiling plate 12 is exposed and thus an abnormal discharge occurs in between the plasma window 421 and the inner peripheral surface.

In this regard, in the film forming apparatus 1 of this example in which the shield member 41 is fixedly arranged at a predetermined height position, since the inner peripheral surface of the ceiling plate 12 is not exposed regardless of the arrangement height position of the receiving vessel 42, the occurrence of abnormal discharge can be suppressed and plasma can be stably formed.

Furthermore, in the case where the receiving vessel 42 and the shield member 41 are integrally configured, when the receiving vessel 42 is arranged at a position where the plasma gap becomes large, the height h' of the gap between the protrusion 411 and the rotary table 2 illustrated in FIG. 6 increases. As a result, it may be difficult to suppress a reduction in concentration of the plasma-generating gas and suppress entry of N$_2$ gas and ozone gas supplied to the outside.

Also regarding this point, in the film forming apparatus 1 of this example in which the protrusion 411 is fixedly arranged at the predetermined height position, since the height h' of the gap between the protrusion 411 and the rotary table 2 is kept constant regardless of the arrangement height position of the receiving vessel 42, the reduction in concentration of the plasma-generating gas and the entry of the gas supplied to the outside can be excellently suppressed at all times.

The film forming apparatus 1 according to this embodiment may have the following effects. Since the shield member 41 is arranged at the preset height position, the state in which the inner peripheral surface of the opening formed in the metallic ceiling plate 12 (vacuum vessel 11) is covered with the shield member 41 is maintained, regardless of the change in the arrangement height position of the receiving vessel 42 by means of the height adjustment part (the frame body portion 43 and the spacers 44a and 44b). Thus, it is possible to form stable plasma.

Next, a configuration example of a film forming apparatus 1a having a height adjustment part which changes the arrangement height position of the receiving vessel 42 by another method will be described with reference to FIGS. 9 and 10. In the film forming apparatus 1a illustrated in FIGS. 9 and 10, components common to those described with reference to FIGS. 1 to 4 and the like are given the same reference numerals to those used in these drawings.

Figure 9:
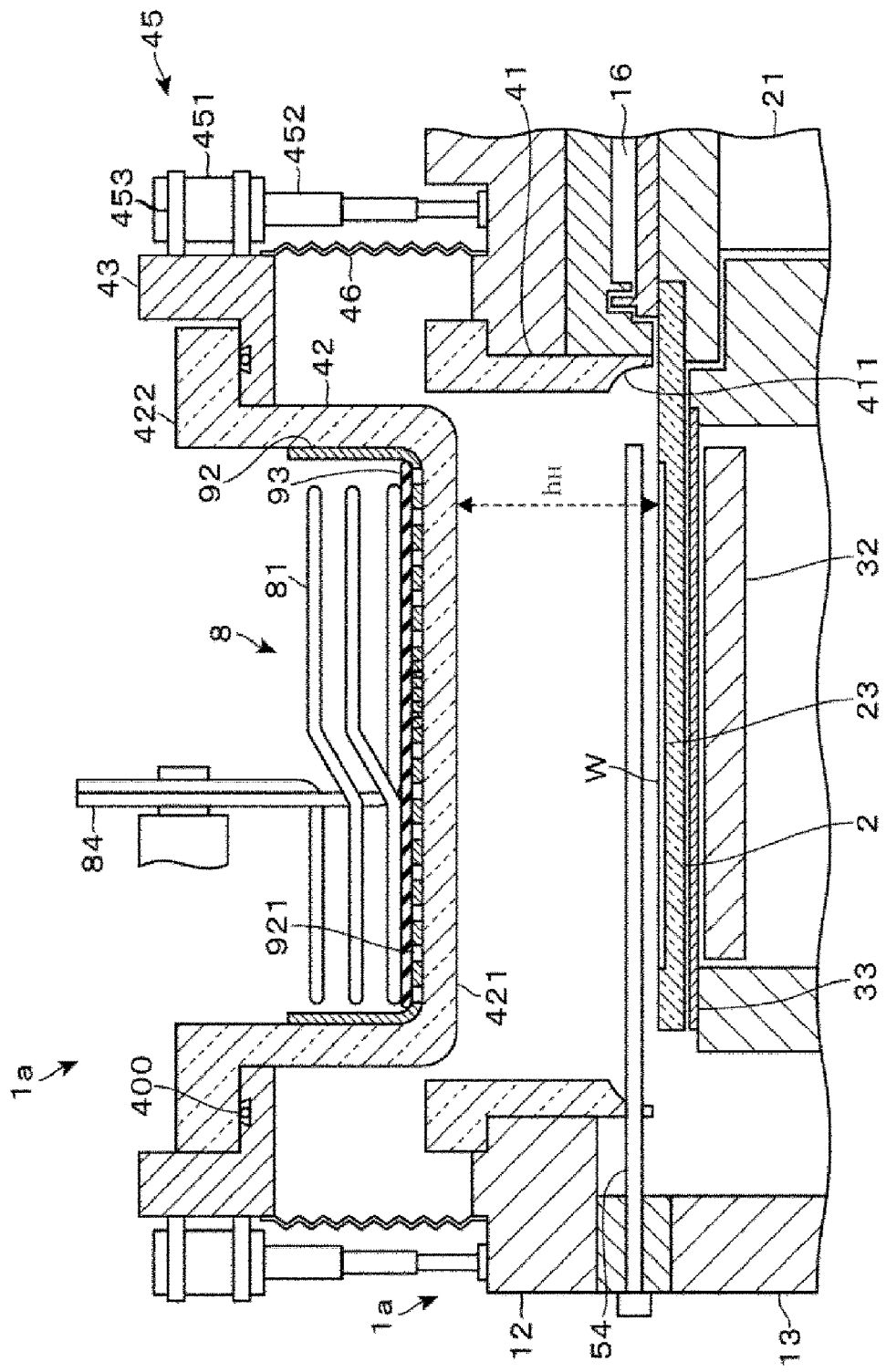
FIG. 9 is a first enlarged longitudinal sectional view of a film forming apparatus having an elevating mechanism of the plasma window.

In the film forming apparatus 1a illustrated in FIGS. 9 and 10, the flange-shaped supported part 422 formed in the upper end portion is supported by the frame body portion 43, and a bellows 46 is installed between the frame body portion 43 and the upper surface of the ceiling plate 12 (vacuum vessel 11). In other words, it can be said that the gap between the supported part 422 and the ceiling plate 12 is closed by the frame body portion 43 and the bellows 46.

Furthermore, on the side circumferential surface of the frame body portion 43 of this example, a plurality of elevating mechanisms 45 is arranged at intervals along the circumferential direction of the frame body portion 43. Each of the elevating mechanisms 45 includes an expandable portion 452 and a drive part 451 for driving the expandable portion 452. In the elevating mechanism 45 of this example, the lower end of the expandable portion 452 is fixed to the upper surface of the ceiling plate 12, while the drive part 451 is fixed to the side circumferential surface of the frame body portion 43 by the support part 453.

In these elevating mechanisms 45, when the expandable portion 452 is extended, the arrangement height position of the receiving vessel 42 moves upward and thus the plasma gap between the plasma window 421 and the rotary table 2 can be increased to be $h_H$ (see FIG. 9). At this time, the bellows 46 extends according to the movement of the receiving vessel 42.

Furthermore, when the expandable portion 452 is retracted, the arrangement height position of the receiving vessel 42 moves downward and thus the plasma gap can be reduced to be $h_L$ (see FIG. 10). At this time, the bellows 46 reduces in size according to the movement of the receiving vessel 42.

In this example, it is illustrated that the bellows 46 is installed between the metallic frame body portion 43 and the ceiling plate 12 for the ease of installing the bellows 46 or the elevating mechanisms 45. However, in the case where the bellows 46 or the elevating mechanism 45 can be installed on the quartz shield member 41, the installation of the frame body portion 43 can be omitted. In this case, it is also possible to adopt a configuration in which the space between the receiving vessel 42 and the shield member 41 is closed by the bellows 46 and the receiving vessel 42 is moved up and down by the elevating mechanisms 45 installed in the receiving vessel 42.

Furthermore, in each of the aforementioned embodiments, there has been described a case where the plasma processing performed in the plasma forming region R3 is a modification process for modifying the $SiO_2$ film (the molecular layer of $SiO_2$) formed on the surface of the wafers W.

However, the content of the plasma processing performed in the plasma forming region R3 is not limited to the aforementioned example. For example, by omitting the arrangement of the oxidizing gas nozzle 53 in the oxidation region R2 illustrated in FIG. 2 and arranging the oxidizing gas nozzle 53 for supplying an ozone gas at a position where the plasma gas nozzle 54 is arranged in FIG. 2, the ozone gas (oxidizing gas) reacts with BTBAS adsorbed onto the wafers W thereby forming plasma.

In the aforementioned example, it can be said that the plasma processing constitutes a part of the film forming process, the ozone gas as the second processing gas also functions as the plasma-generating gas, and the oxidizing gas nozzle 53 as the second processing gas supply part also corresponds to the plasma-generating gas supply part.

In addition, the configuration of the plasma forming part 8 is not limited to the case of using the antenna 81 which forms plasma by inductive coupling with the plasma-generating gas. For example, a microwave type plasma forming part, which generates plasma by propagating a microwave generated by a microwave generator to the dielectric plate installed in the bottom surface portion of the receiving vessel 42 via a waveguide and supplying the microwave from the dielectric plate toward the plasma-generating gas, may be installed.

In addition, if it is undesirable to process the wafers W in a space where metal is exposed from the viewpoint of preventing the wafers W from being contaminated by the metal, for example, a quartz vessel is installed in the vacuum vessel 11, the rotary table 2 may be arranged in the quartz vessel. In this case, an opening for inserting the receiving vessel 42 of the plasma forming part 8 or the shield member 41 is formed on the upper surface side of the quartz vessel.

Furthermore, the raw material of the $SiO_2$ film and the type of the film formed by using the film forming apparatus 1 of this example are not limited to the aforementioned examples. The $SiO_2$ film may be formed by using, for example, a dichlorosilane (DCS) gas as the raw material gas (the first processing gas) and an ozone gas or plasma of the ozone gas as the oxidizing gas (the second processing gas or the plasma-generating gas). The film forming apparatuses 1 and 1a of this example may also be applied to various film forming processes, for example, a film forming process in which an SiN film is formed by using a DCS gas or a BTBAS gas as the raw material gas and using, instead of the oxidizing gas, a nitriding gas (the second processing gas or the plasma-generating gas) such as an ammonia ($NH_3$) gas, a dinitrogen monoxide ($N_2O$) gas or plasma of these gases.

According to the present disclosure in some embodiments, since the shield member is disposed at a preset height position, it is possible to maintain the state in which the inner peripheral surface of the opening formed in the metallic vacuum vessel is covered with the shield member, irrespective of the change in the arrangement height position of the receiving vessel by means of the height adjustment part. Thus, it is possible to form stable plasma.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming apparatus for forming a film by sequentially supplying a first processing gas and a second processing gas to a substrate while rotating the substrate around a center of rotation of a rotary table located within a vacuum vessel made of metal by mounting the substrate on a substrate mounting region located on an upper surface side of the rotary table and rotating the rotary table, the apparatus comprising:

a first processing gas supply part and a second processing gas supply part configured to supply the first processing gas and the second processing gas to a first processing region and a second processing region, respectively, which are separated from each other in a circumferential direction of the rotary table via separation regions;

a plasma gas nozzle configured to supply a plasma-generating gas for performing a plasma processing on the substrate into the vacuum vessel;

a plasma generator configured to convert the plasma-generating gas into plasma;

a receiving vessel inserted into an opening formed in a ceiling portion of the vacuum vessel, the receiving vessel having a bottom portion facing an upper surface of the rotary table and being engaged with the plasma generator on an upper surface of the bottom portion;

a dielectric shield member arranged between the receiving vessel and an inner peripheral surface of the ceiling portion and located annularly along a circumferential direction of the inner peripheral surface of the ceiling portion;

a height adjustment part configured to adjust an arrangement height position of the bottom portion of the receiving vessel inserted into the vacuum vessel; and one or more sealing parts configured to hermetically close a space between the vacuum vessel and the receiving vessel inserted into the opening, wherein the dielectric shield member is disposed to cover the inner peripheral surface of the ceiling portion, wherein the dielectric shield member is installed separately from the receiving vessel such that a gap is formed between an outer side surface of the receiving vessel and an inner side surface of the dielectric shield member, wherein the dielectric shield member includes a protrusion extending from a lower end portion of the dielectric shield member and protruding downward from a lower surface of the ceiling portion, and wherein the plasma gas nozzle is installed in a region surrounded by the protrusion.

2. The apparatus of claim 1, wherein a gap narrower than a distance between the upper surface of the rotary table and the bottom portion of the receiving vessel is located between the protrusion and the rotary table.

3. The apparatus of claim 1, wherein the receiving vessel includes a flange-shaped supported part formed along the circumferential direction of the receiving vessel protruding from the opening to the outside of the vacuum vessel, and wherein the height adjustment part is arranged between the upper surface of the vacuum vessel around the opening and the supported part of the receiving vessel and configured by an annular member that supports the receiving vessel on the vacuum vessel via the supported part, the arrangement height position of the bottom portion being adjusted by replacement of the annular member with another annular member different in height from the annular member, and wherein the one or more sealing parts are installed between the vacuum vessel and the height adjustment part and between the height adjustment part and the supported part.

4. The apparatus of claim 3, wherein the annular member is vertically divided into an upper annular member that supports the supported part and a lower annular member arranged between the upper annular member and the upper surface of the vacuum vessel, wherein the replacement of the annular member is performed by omitting the arrangement of the lower annular member and arranging the upper annular member directly on the upper surface of the vacuum vessel or by replacing the lower annular member with another lower annular member different in height with the lower annular member, and wherein when the lower annular member and the upper annular member are arranged between the upper surface of the vacuum vessel and the supported part, the one or more sealing parts are also arranged between the lower annular member and the upper annular member.

5. The apparatus of claim 1, wherein the height adjustment part includes an elevating mechanism configured to support and move the receiving vessel in a vertical direction, and wherein the one or more sealing parts are configured to hermetically close the space between the vacuum vessel and the receiving vessel inserted into the opening, and includes a bellows which is expandable and contractible according to a vertical movement of the receiving vessel.

6. The apparatus of claim 1, wherein the plasma generator includes: an antenna installed to face the upper surface of the rotary table and configured to convert the plasma-generating gas into plasma by inductive coupling; and a Faraday shield configured to prevent an electric field component of an electromagnetic field generated around the antenna from passing and allow a magnetic field component of the electromagnetic field to pass toward the plasma-generating gas, the Faraday shield including a grounded conductive plate body in which a plurality of slits extending in a direction perpendicular to the antenna is arranged along an extending direction of the antenna, and wherein the receiving vessel is made of a dielectric material.

7. The apparatus of claim 1, wherein the plasma processing is part of a film forming process, the plasma-generating gas is the second processing gas, and the plasma gas nozzle is the second processing gas supply part.

8. The apparatus of claim 1, wherein the plasma gas nozzle is configured to supply the plasma-generating gas to a region at a downstream side in a rotation direction of the rotary table, and the plasma processing is a modification process for modifying a film formed on the substrate by reaction of the first processing gas and the second processing gas.

* * * * *